United States Patent
Ali

(10) Patent No.: US 7,480,145 B2
(45) Date of Patent: Jan. 20, 2009

(54) THIN, PASSIVE COOLING SYSTEM

(75) Inventor: Ihab A. Ali, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 266 days.

(21) Appl. No.: 11/591,926

(22) Filed: Nov. 1, 2006

(65) Prior Publication Data

US 2008/0101026 A1    May 1, 2008

(51) Int. Cl.
*H05K 7/20*    (2006.01)
*F28F 7/00*    (2006.01)

(52) U.S. Cl. .................. 361/708; 361/714; 361/719; 165/185; 174/15.1; 257/713

(58) Field of Classification Search ......... 361/704–708, 361/714–715, 719; 165/185; 174/15.1; 257/712, 257/713

See application file for complete search history.

(56) References Cited

U.S. PATENT DOCUMENTS

| | | | |
|---|---|---|---|
| 5,812,375 A | 9/1998 | Casperson | |
| 6,466,441 B1 * | 10/2002 | Suzuki | 361/695 |
| 6,903,931 B2 * | 6/2005 | McCordic et al. | 361/711 |
| 2005/0238835 A1 | 10/2005 | Sung | |
| 2005/0270746 A1 * | 12/2005 | Reis | 361/708 |
| 2006/0086493 A1 | 4/2006 | Fujiwara et al. | |
| 2006/0171124 A1 | 8/2006 | Capp et al. | |

* cited by examiner

*Primary Examiner*—Jayprakash N Gandhi
*Assistant Examiner*—Zachary M Pape
(74) *Attorney, Agent, or Firm*—Park, Vaughan & Fleming LLP; Steven E. Stupp

(57) ABSTRACT

A system includes a power source and a heat-shield mechanism which encloses the power source. This heat-shield mechanism includes a 3-dimensional housing that defines a cavity in which the power source resides, and a plate that is positioned to cover an opening to the cavity that is defined by an edge of the housing. Note that the housing contains three layers in which a second layer is sandwiched between a first layer and a third layer. This second layer has a first anisotropic thermal conductivity. Furthermore, the plate includes a material having a second anisotropic thermal conductivity.

20 Claims, 4 Drawing Sheets

US 7,480,145 B2

THIN, PASSIVE COOLING SYSTEM

BACKGROUND

1. Field of the Invention

The present invention relates to heat-transfer techniques. More specifically, the present invention relates to compact, passive cooling components for use in electronic devices.

2. Related Art

The computational performance provided by electronic devices has increased significantly in recent years. This has resulted in increased power consumption and associated heat generation in these products. Consequently, it has become a considerable challenge to manage this thermal load to maintain acceptable internal and external operating temperatures for these devices.

Portable devices, such as laptop computers (notebook PCs), cellular telephones, and personal digital assistants pose additional design constraints. In particular, size and weight limitations in such devices can make it difficult to achieve desired operational temperatures. For example, in many applications the size and weight of metal heat sinks may be prohibitive. In addition, battery life in such devices may preclude the use of active cooling mechanisms, such as fans.

Hence what is needed are electronic devices that include compact and passive cooling mechanisms that overcome the problems listed above.

SUMMARY

One embodiment of the present invention provides a system that includes a power source and a heat-shield mechanism which encloses the power source. This heat-shield mechanism includes a 3-dimensional housing that defines a cavity in which the power source resides, and a plate that is positioned to cover an opening to the cavity defined by an edge of the housing. Note that the housing contains three layers in which a second layer is sandwiched between a first layer and a third layer. This second layer has a first anisotropic thermal conductivity. Furthermore, the plate includes a material having a second anisotropic thermal conductivity.

In some embodiments, the first layer and the third layer include metal, such as aluminum, copper, magnesium, an aluminum alloy, a copper alloy, and/or a magnesium alloy.

In some embodiments, the plate is covered by an overcoat. This overcoat may include a polymer, such as Mylar®.

In some embodiments, the plate is coupled to a surface inside of the system, for example, using an adhesive.

In some embodiments, the second layer includes graphite and the plate includes graphite.

In some embodiments, the power source is associated with an integrated circuit. Furthermore, in some embodiments the heat-shield mechanism provides passive cooling of the power source.

In some embodiments, the system includes a portable computing device.

In some embodiments, the system operates to ensure a temperature on an outer surface of the system is less than a first pre-determined value and/or a temperature inside of the heat-shield mechanism is less than a second pre-determined value.

In some embodiments, the housing has a weight less than a pre-determined value.

BRIEF DESCRIPTION OF THE FIGURES

Note that like reference numerals refer to corresponding parts throughout the drawings.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a system are described that includes a power source and a heat-shield mechanism which encloses the power source. This heat-shield mechanism provides passive cooling of the power source, which may be associated with an integrated circuit. Note that the system may include stationary and/or portable electronic devices (which are henceforth referred to as "portable computing devices"), such as desktop computers, laptop computers, cellular telephones, personal digital assistants, game consoles, and MP3 players.

The heat-shield mechanism may include a 3-dimensional housing that defines a cavity in which the power source resides, and a plate that is positioned to cover an opening to the cavity that is defined by an edge of the housing. Note that the housing contains three layers in which a second layer is sandwiched between a first layer and a third layer. This second layer has a first anisotropic thermal conductivity. Furthermore, the plate includes a material having a second anisotropic thermal conductivity. For example, the second layer and the plate may each include graphite, and the first and second layer may include a metal and/or a metal alloy. In addition, the plate may be protected by an overcoat, such as a polymer.

The heat-shield mechanism may be very compact and may have a light weight. For example, the first and third layers may have a thickness less than or equal to 0.1 mm, and the second layer may have a thickness less than or equal to 0.1 mm. In addition, the weight of the housing may be less than or equal to 5 grams.

Such a thin, passive cooling component may allow desired operational temperatures to be achieved in portable computing devices without using active cooling, or heavy or large components such as heat sinks. As a consequence, during operation of the system a temperature on an outer surface of the system may be less than a first pre-determined value and/or a temperature inside of the heat-shield mechanism may be less than a second pre-determined value. For example, the first pre-determined value may be 50 C and the second pre-determined value may be less than 80 C.

Figure 1A:
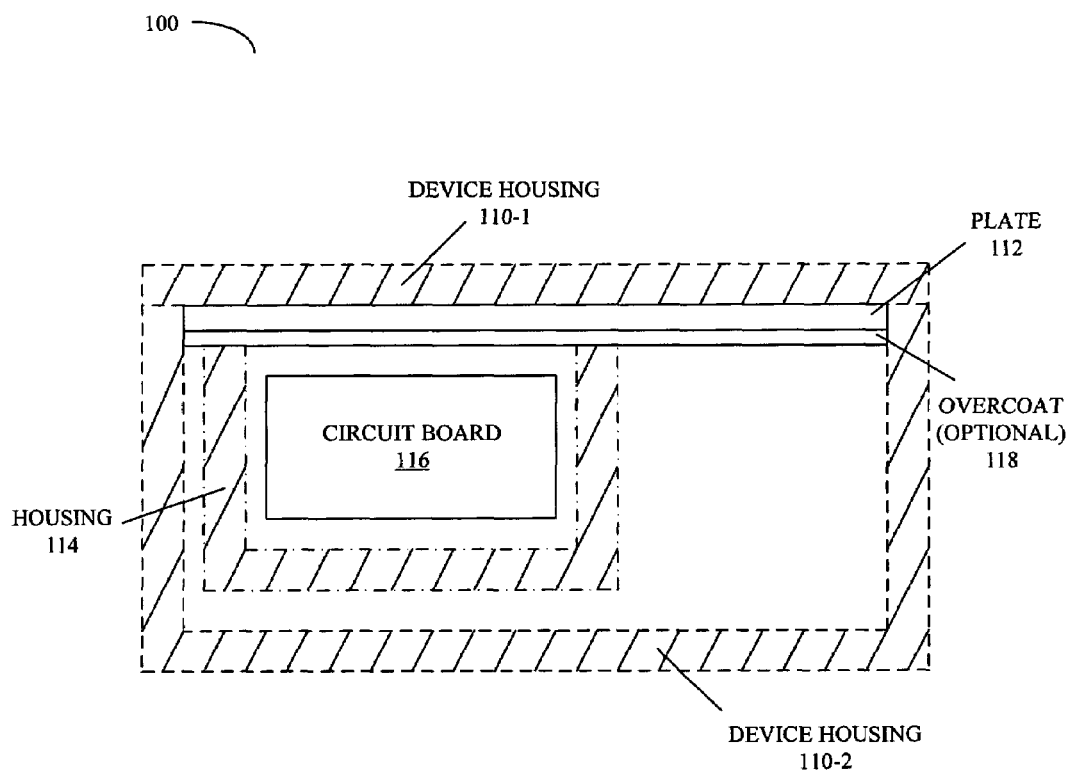
FIG. 1A is a block diagram illustrating a portable computing device in accordance with an embodiment of the present invention.
Figure 1B:
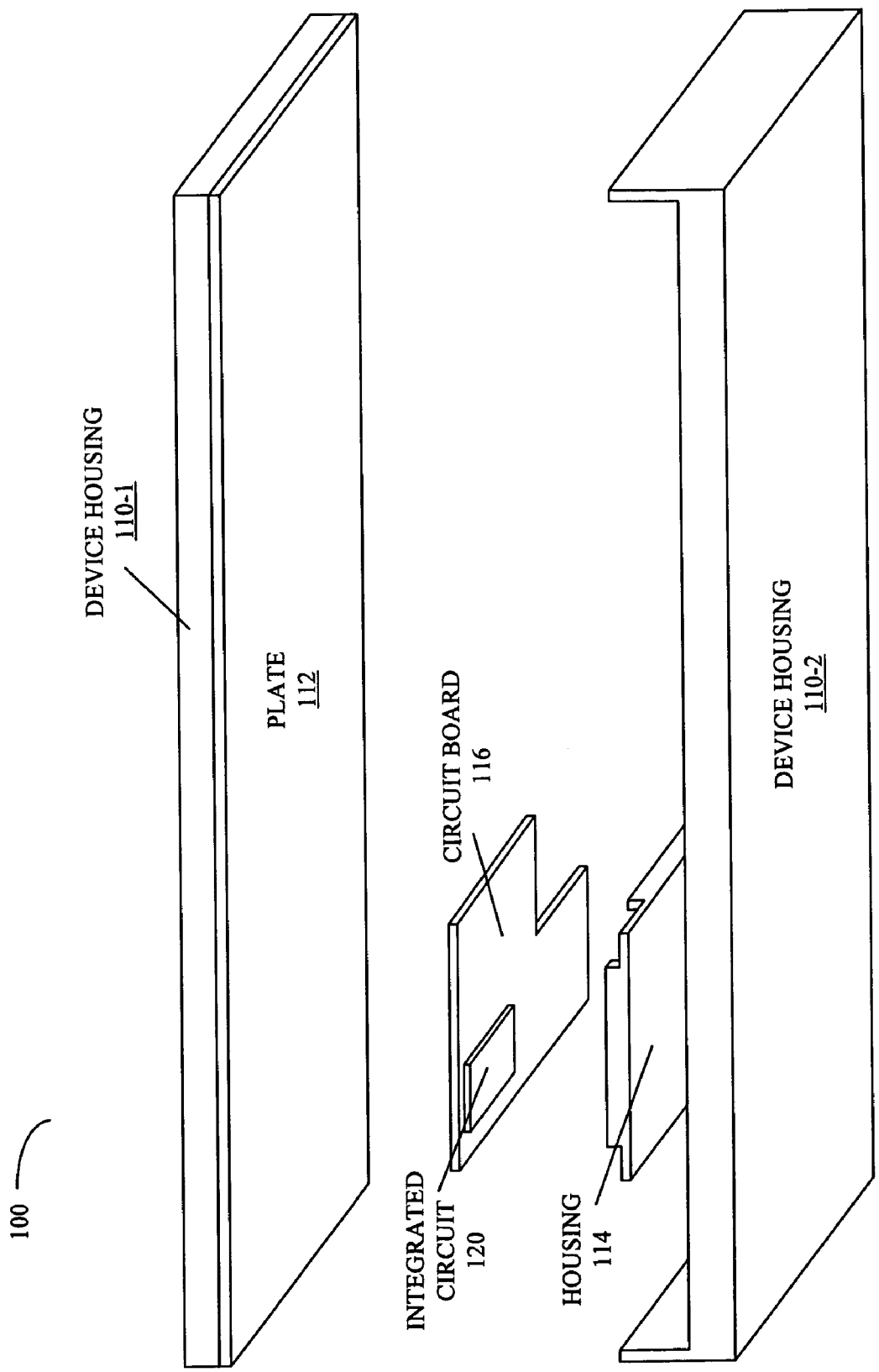
FIG. 1B is a block diagram illustrating a portable computing device in accordance with an embodiment of the present invention.

We now describe embodiments of the system and the thin, passive cooling component. FIG. 1A provides a block diagram illustrating a cross-sectional view of an portable computing device 100 in accordance with an embodiment of the present invention, and FIG. 1B provides a block diagram illustrating an exploded view of the portable computing device 100 in accordance with an embodiment of the present invention. Portable computing device 100 includes a circuit board 116 that is enclosed in a 3-dimensional heat-shield mechanism. This heat-shield mechanism is contained in an enclosed area within the portable computing device 100, and the enclosed area is defined by device housing 110-1 and device housing 110-2.

Note that the circuit board 116 includes one or more integrated circuits 120 that, when operating, are power sources (i.e., produce heat). Furthermore, the heat-shield mechanism includes a housing 114 that defines a cavity in which the circuit board 116 resides and a plate 112 that covers an opening to the cavity. This opening is defined by an edge of the housing 114. In some embodiments, optional overcoat 118 covers and protects the plate 112 from scratches and/or electrically isolates the plate 112. For example, the overcoat 118 may include a polymer, such as Mylar®.

The plate 112 may be coupled to a surface in the portable computing device 100. In particular, the plate 112 may be attached by an adhesive layer (not shown) to a portion of the device housing 110-1. For example, the device housing 110-1 may include a display, a keyboard assembly, or a back panel.

Furthermore, the plate 112 may include a material having an anisotropic thermal conductivity. For example, the plate 112 may include graphite, which has an in-plane thermal conductivity that is 50-100 times larger than an out-of-plane thermal conductivity. This anisotropy may thermally insulate an external surface of the portable computing device 110 from radiated heat. In particular, the plate 112 may allow heat to spread or diffuse along the inner surfaces of the device housing 110-1, thereby reducing the temperature on one or more of the external surfaces of the portable computing device 110. In an exemplary embodiment, heat is absorbed and spread to a front or top screen surface thereby reducing the temperature as well as temperature gradients on a back panel.

Figure 2:
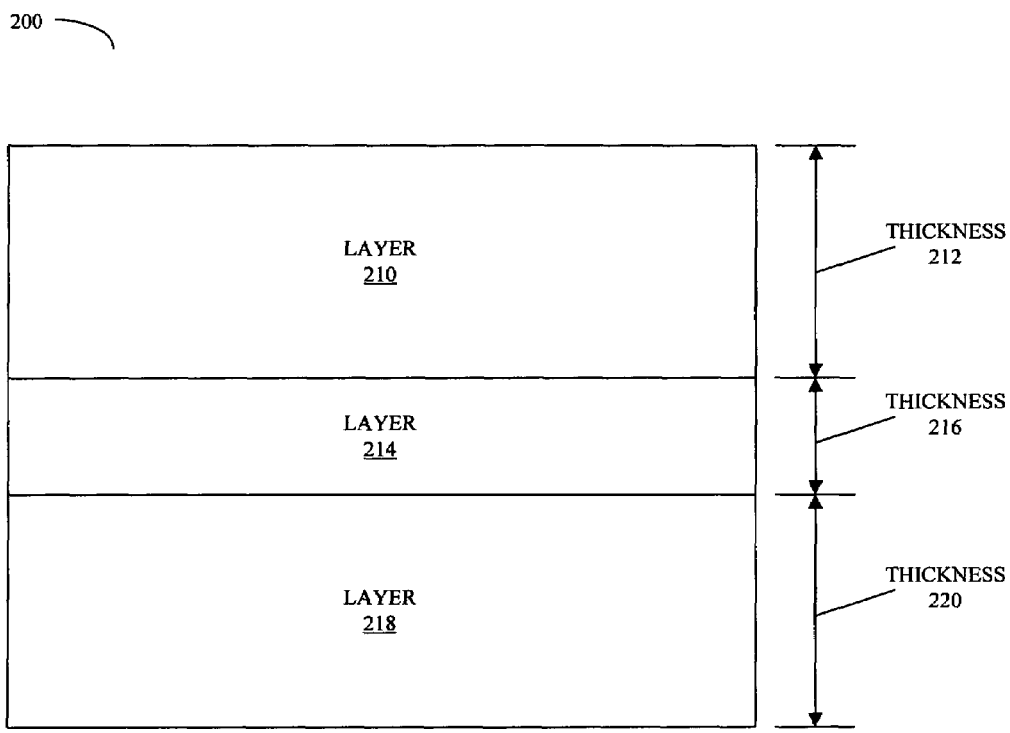
FIG. 2 is a block diagram illustrating a housing in accordance with an embodiment of the present invention.

The housing 114 in the heat-shield mechanism may include multiple laminated layers. This is illustrated in FIG. 2, which provides a block diagram illustrating a housing 200 in accordance with an embodiment of the present invention. The housing 200 includes 3 layers, a first layer 210 with a thickness 212, a second layer 214 with a thickness 216, and a third layer 218 with a thickness 220. Note that the first layer 210 and the third layer 218 may include a metal and/or a metal alloy, such as aluminum, copper, magnesium, an aluminum alloy, a copper alloy, and/or a magnesium alloy. These layers may provide mechanical stiffness for the 3-dimensional housing 114 (FIGS. 1A and 1B), and may provide mechanical protection for the second layer 214 from scratches and/or electrically isolate the second layer 214. In addition, the first layer 210 and the third layer 218 may absorb and spread (diffuse) received heat from the circuit board 116 (FIGS. 1A and 1B). Furthermore, the second layer 214 may include a material that has an anisotropic thermal conductivity, such as graphite.

In an exemplary embodiment, the first layer 210 and the third layer 218 are aluminum, and the second layer 214 is graphite. Furthermore, thickness 212 may be 0.1 mm, thickness 216 may be 0.1 mm, and thickness 220 may be 0.1 mm. Note that a total weight of the housing 114 (FIGS. 1A and 1B) may be less than or equal to 5 grams. In addition, the plate 112 (FIGS. 1A and 1B) may be graphite and may be 0.1 mm thick, and the overcoat 118 (FIG. 1) may be Mylar® and may be 0.1 mm thick.

Thermal simulations performed using commercially available computational fluid dynamics software, such as Icepak™ (from Ansys, Inc., of Canonsburg, Pa.), with parameters corresponding to this exemplary embodiment indicate that the heat-shield mechanism reduces a temperature on the external surface of the device housing 110-1 (FIG. 1A) from 60-70 C to less than 50 C. In addition, a temperature around the circuit board 116 (FIGS. 1A and 1B) is calculated to be reduced from 150 C to less than 80 C.

Thus, the heat-shield mechanism may passively dissipate heat generated by the components (such as the one or more integrated circuits 120) on the circuit board 116 (FIGS. 1A and 1B). Furthermore, this mechanism may be very compact (i.e., thin) and light weight, which may make it suitable for applications with significant size, weight, and battery-life constraints that may preclude the use of active cooling mechanisms (such as fans) and/or metal heat sinks.

Figure 3A:
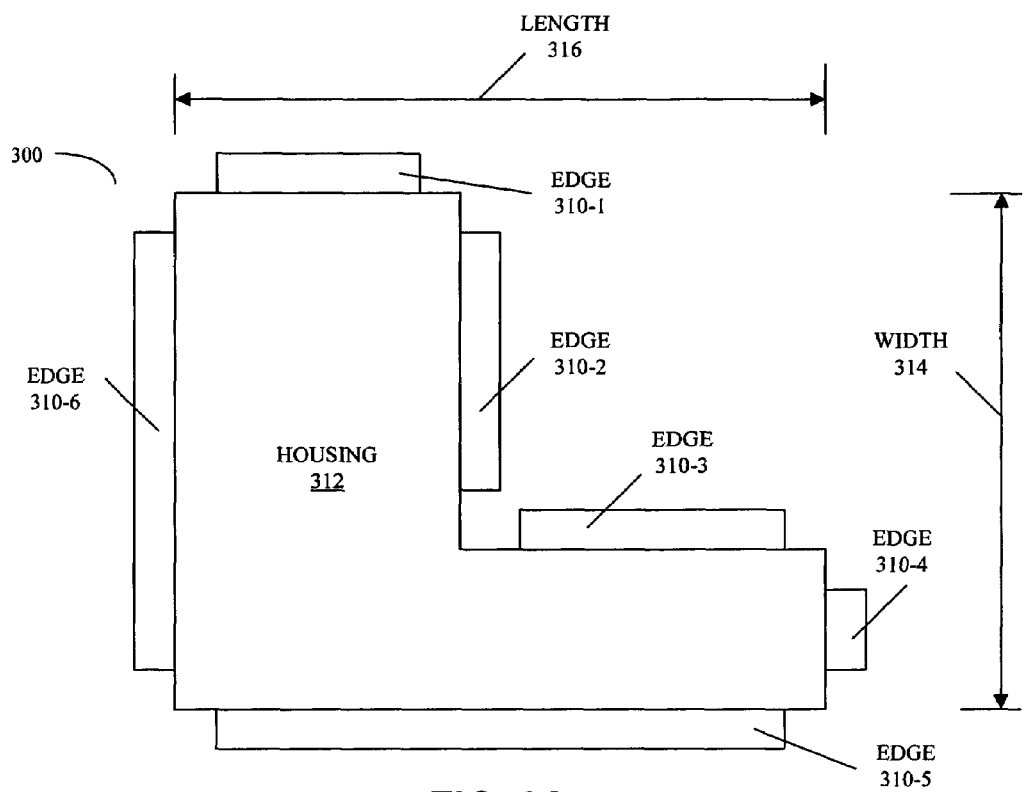
FIG. 3A is block diagram illustrating a housing in accordance with an embodiment of the present invention.
Figure 3B:
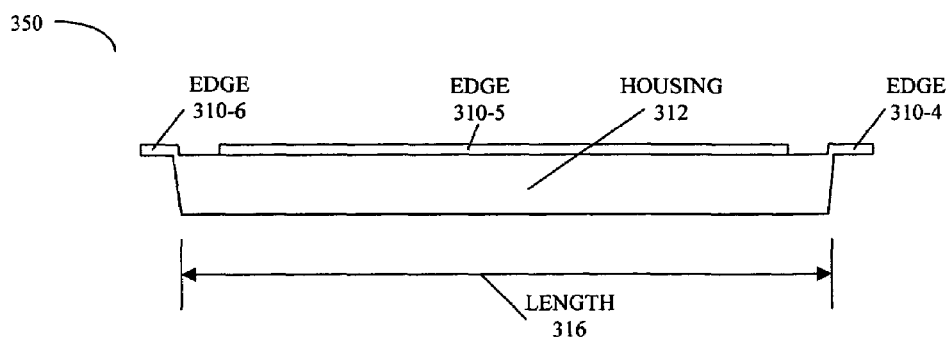
FIG. 3B is block diagram illustrating a housing in accordance with an embodiment of the present invention.

As noted above, the housing 114 (FIGS. 1A and 1B) in the heat shield mechanism is 3-dimensional in order to define the cavity that encloses the circuit board 116 (FIGS. 1A and 1B). FIG. 3A provides block diagram illustrating a top view 300 of a housing 312 (such as the housing 114 in FIGS. 1A and 1B) in accordance with an embodiment of the present invention, and FIG. 3B provides a block diagram illustrating a side view 350 of the housing 312 in accordance with an embodiment of the present invention. Note that the housing 312 has the shape of the letter L, including a width 314 of up to 8.0 cm and a length of up to 16.0 cm, in order to properly accommodate the circuit board 116 (FIGS. 1A and 1B). In addition, the housing 312 includes edges 310. These structures provide electrical contact and thermally anchor the housing 312 to the plate 112 (FIGS. 1A and 1B) in the heat-shield mechanism.

Note that in some embodiments the portable computing device 100 (FIGS. 1A and 1B), the housing 200 (FIG. 2), and/or the housing 300 include fewer or additional components, two or more components are combined into a single component, and/or a position of one or more components may be changed. For example, the housing 200 (FIG. 2) may include fewer or additional layers.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A system, comprising:
 a power source; and
 a heat-shield mechanism which encloses the power source, wherein the heat-shield mechanism includes:
  a housing which is 3-dimensional, wherein the housing defines a cavity in which the power source resides, wherein an edge of the housing defines an opening to the cavity, wherein the housing contains three layers in which a second layer is sandwiched between a first layer and a third layer, and wherein the second layer has a first anisotropic thermal conductivity; and
  a plate which includes a material having a second anisotropic thermal conductivity, wherein the plate is positioned to cover the opening to the cavity thereby enclosing the power source.

2. The system of claim 1, wherein the first layer has a thickness less than or equal to 0.1 mm.

3. The system of claim 1, wherein the second layer has a thickness less than or equal to 0.1 mm.

4. The system of claim 1, wherein the third layer has a thickness less than or equal to 0.1 mm.

5. The system of claim 1, wherein the first layer and the third layer include metal.

6. The system of claim 5, wherein the metal includes aluminum, copper, magnesium, an aluminum alloy, a copper alloy, or a magnesium alloy.

7. The system of claim 1, wherein the plate is covered by an overcoat.

8. The system of claim 7, wherein the overcoat includes a polymer.

9. The system of claim 7, wherein the overcoat includes Mylar®.

10. The system of claim 1, wherein the plate is coupled to a surface inside of the system.

11. The system of claim 1, wherein the second layer includes graphite, and wherein the plate includes graphite.

12. The system of claim 1, wherein the power source is associated with an integrated circuit.

13. The system of claim 1, wherein the heat-shield mechanism provides passive cooling of the power source.

14. The system of claim 1, wherein the system includes a portable computing device.

15. The system of claim 1, wherein the system ensures that a temperature on an outer surface of the system is less than a pre-determined value.

16. The system of claim 15, wherein the pre-determined value is less than 50 C.

17. The system of claim 1, wherein the system ensures that a temperature inside of the heat-shield mechanism is less than a pre-determined value.

18. The system of claim 17, wherein the pre-determined value is less than 80 C.

19. The system of claim 1, wherein the housing has a weight less than or equal to a pre-determined value.

20. The system of claim 19, wherein the pre-determined value is 5 grams.

* * * * *